US007911217B2

(12) United States Patent
Nam

(10) Patent No.: US 7,911,217 B2
(45) Date of Patent: Mar. 22, 2011

(54) LIQUID CRYSTAL DISPLAY, CONNECTOR AND METHOD OF TESTING THE LIQUID CRYSTAL DISPLAY

(75) Inventor: Hyun-woo Nam, Asan-si (KR)

(73) Assignee: Samsung Electronics Co., Ltd. (KR)

( * ) Notice: Subject to any disclaimer, the term of this patent is extended or adjusted under 35 U.S.C. 154(b) by 864 days.

(21) Appl. No.: 11/850,415

(22) Filed: Sep. 5, 2007

(65) Prior Publication Data

US 2008/0150856 A1 Jun. 26, 2008

(30) Foreign Application Priority Data

Dec. 22, 2006 (KR) ........................ 10-2006-0133053

(51) Int. Cl.
*G01R 31/00* (2006.01)

(52) U.S. Cl. .................................................. 324/760.01

(58) Field of Classification Search ............... 324/158.1, 324/761, 765, 770; 349/58–60
See application file for complete search history.

(56) References Cited

U.S. PATENT DOCUMENTS 6,137,300 A * 10/2000 Hayashida .................... 324/758
6,590,624 B1 * 7/2003 Lee ................................ 349/54
6,710,607 B2 * 3/2004 Fujii et al. ..................... 324/750
6,759,867 B2 * 7/2004 Sohn ............................. 324/770
6,794,892 B2 * 9/2004 Matsueda ...................... 324/770
6,842,026 B2 * 1/2005 Yamaoka et al. ............. 324/761
6,891,391 B2 * 5/2005 Hiroki ........................... 324/765
6,940,271 B2 * 9/2005 West .......................... 324/158.1
7,439,757 B2 * 10/2008 Kang et al. .................... 324/770
2004/0246018 A1 * 12/2004 Takada .......................... 324/770

FOREIGN PATENT DOCUMENTS

KR 1020060131021 12/2006

* cited by examiner

*Primary Examiner* — Ha Tran T Nguyen
*Assistant Examiner* — Joshua Benitez
(74) *Attorney, Agent, or Firm* — Cantor Colburn LLP

(57) ABSTRACT

A liquid crystal which self-generates a high voltage for a high voltage stress test, a connector for testing the liquid crystal display and a method of testing the liquid crystal display include an internal connector having an input pin which receives a power supply voltage from an outside source, a no-connect pin, a ground pin and a power supply unit connected to the no-connect pin and the ground pin. The power supply unit receives the power supply voltage and outputs a gate-on voltage and a gate-off voltage whose levels are adjusted according to whether there is an electrical connection between the no-connect pin and the ground pin. Agate driving unit receives the gate-on voltage and the gate-off voltage and outputs a gate signal and a liquid crystal panel having a plurality of pixels receives the gate signal and displays images in response to the gate signal.

13 Claims, 7 Drawing Sheets

----: NORMAL OPERATION (NC PIN IS ELECTRICALLY DISCONNECTED FROM GROUND PIN)
——: TESTING (NC PIN IS ELECTRICALLY CONNECTED TO GROUND PIN)

LIQUID CRYSTAL DISPLAY, CONNECTOR AND METHOD OF TESTING THE LIQUID CRYSTAL DISPLAY

This application claims priority to Korean Patent Application No. 10-2006-0133053, filed on Dec. 22, 2006, and all the benefits accruing therefrom under 35 U.S.C. §119, the contents of which in its entirety are herein incorporated by reference.

BACKGROUND OF THE INVENTION

1. Field of the Invention

The present invention relates to a liquid crystal display ("LCD"), a connector for testing the liquid crystal display and a method of testing the liquid crystal display. More specifically, the present invention relates to a liquid crystal display, a connector for testing the liquid crystal display and a method of testing the liquid crystal display which do not require a separate apparatus for conducting a high voltage stress test of the liquid crystal display.

2. Description of the Related Art

LCDs include a first display panel including pixel electrodes, a second display panel including a common electrode, a liquid crystal layer having dielectric anisotropy interposed between the first display panel and the second display panel, a gate driver which drives a plurality of gate lines, a data driver which outputs data signals, and a driver which generates and outputs a reference grayscale voltage and a gate turn-on/off voltage.

After LCDs are manufactured they are tested using a separate testing apparatus to detect defective LCDs. A high voltage stress ("HVS") test is a method for testing the operation of an LCD in which a higher than rated voltage is applied to the LCD. For an HVS test, a separate HVS testing apparatus for providing a high voltage is used, and LCDs are electrically connected to the HVS testing apparatus in order to perform the test.

According to a conventional HVS testing technique, a separate HVS testing apparatus for providing a high voltage is required, thereby increasing manufacturing costs of LCDs, and requiring a complicated testing procedure after an LCD is manufactured.

BRIEF SUMMARY OF THE INVENTION

The present invention provides a liquid crystal display capable of self-generating a high voltage for a high voltage stress ("HVS") test.

The present invention also provides a connector for testing a liquid crystal display capable of self-generating a high voltage for a HVS test.

The present invention also provides a method of testing a liquid crystal display capable of self-generating a high voltage for a HVS test.

These and other aspects, features, and advantages of the present invention will be described in or be apparent from the following description of exemplary embodiments thereof.

According to an exemplary embodiment of the present invention, a liquid crystal display includes an internal connector including an input pin which receives a power supply voltage from an outside source, a no-connect ("NC") pin and a ground pin. The liquid crystal display further includes a power supply unit connected to the NC pin and to the ground pin. The power supply unit receives the power supply voltage and outputs a gate-on voltage and a gate-off voltage whose levels are adjusted according to whether there is an electrical connection or disconnection between the NC pin and the ground pin. The liquid crystal display further includes a gate driving unit which receives the gate-on voltage and the gate-off voltage and outputs a gate signal, and a liquid crystal panel receiving the gate signal and comprising a plurality of pixels displaying images in response to the gate signal.

The gate-on voltage rises and the gate-off voltage falls when the NC pin is electrically connected to the ground pin.

The liquid crystal display is tested when the NC pin is electrically connected to the ground pin.

The liquid crystal display operates normally when the NC pin is electrically disconnected from the ground pin, and the gate-on voltage is lower and the gate-off voltage is higher compared to when the NC pin is electrically connected to the ground pin.

The power supply unit includes a boosting portion which boosts a first input voltage and outputs a driving voltage and a pulse signal whose voltage levels vary according to a feedback voltage, a feedback voltage generating portion which divides the driving voltage to generate the feedback voltage, a gate-on voltage generating portion which outputs the gate-on voltage by shifting the driving voltage by the voltage level of the pulse signal and a gate-off voltage generating portion which outputs the gate-off voltage by shifting a second input voltage by the voltage level of the pulse signal.

The NC pin is electrically connected to the ground pin, the feedback voltage falls, the gate-on voltage rises, and the gate-off voltage falls.

The feedback voltage generating portion includes a first resistor connected between a first terminal which supplies the driving voltage and a second terminal which supplies the feedback voltage and a second resistor connected between the second terminal which supplies the feedback voltage and a third terminal which is connected to a ground voltage.

The liquid crystal display further includes a connecting member which electrically connects the NC pin and the ground pin when the liquid crystal display is tested.

According to another exemplary embodiment of the present invention, a connector for testing a liquid crystal display includes a transmitting unit which receives a power supply voltage, a ground voltage, and a testing image signal from an outside source and transmits the received power supply voltage, the ground voltage, and the testing image signal to the liquid crystal display, and a connecting unit which electrically connects an NC pin and a ground pin in an internal connector of the liquid crystal display which receives the power supply voltage, the ground voltage, and the testing image signal.

The transmitting unit includes input terminals which receive the power supply voltage, the ground voltage and the testing image signal, and output terminals which output the received power supply voltage, the ground voltage and the testing image signal. The connecting unit includes a first connecting terminal connected to the NC pin and a second connecting terminal connected to the ground pin, and the first connecting terminal is electrically connected to the second connecting terminal.

When the liquid crystal display is tested, the connector is connected to the internal connector of the liquid crystal display and transmits the power supply voltage, the ground voltage and the testing image signal to the liquid crystal display.

According to yet another exemplary embodiment of the present invention, a method of testing a liquid crystal display includes providing a liquid crystal display to be tested.

The liquid crystal display includes an internal connector having an input pin receiving a power supply voltage from an external source, an NC pin and a ground pin. The liquid crystal display further includes a power supply unit connected to the NC pin and the ground pin, and the power supply unit receives the power supply voltage and outputs a gate-on voltage and a gate-off voltage whose levels are adjusted according to whether there is an electrical connection or disconnection between the NC pin and the ground pin. The NC pin is electrically connected to the ground pin.

The gate-on voltage rises and the gate-off voltage falls when the NC pin is electrically connected to the ground pin.

The electrical connecting of the NC pin and the ground pin includes connecting a connector to the internal connector. The connector includes a transmitting unit which receives a power supply voltage, a ground voltage, and a testing image signal from an outside source and transmits the received power supply voltage, the ground voltage and the testing image signal to the liquid crystal display. The connector further includes a connecting unit which electrically connects an NC pin and a ground pin in an internal connector of the liquid crystal display which receives the power supply voltage, the ground voltage and the testing image signal.

The power supply unit includes a boosting portion boosting a first input voltage and outputting a driving voltage and a pulse signal whose voltage levels vary according to a feedback voltage, a feedback voltage generating portion dividing the driving voltage and generating the feedback voltage, a gate-on voltage generating portion outputting the gate-on voltage by shifting the driving voltage by the voltage level of the pulse signal and a gate-off voltage generating portion outputting the gate-off voltage by shifting a second input voltage by the voltage level of the pulse signal. The electrical connecting of the NC pin and the ground pin includes causing the feedback voltage to fall.

The feedback voltage generating portion includes a first resistor connected between a first terminal supplying the driving voltage and a second terminal supplying the feedback voltage and a second resistor connected between the second terminal supplying the feedback voltage and a third terminal which is connected to a ground voltage. The electrical connecting of the NC pin and the ground pin includes causing an equivalent resistance between the feedback voltage and the ground voltage to fall.

BRIEF DESCRIPTION OF THE DRAWINGS

The above and other aspects, features and advantages of the present invention will become more apparent by describing in further detail exemplary embodiments thereof with reference to the attached drawings, in which.

DETAILED DESCRIPTION OF THE INVENTION

Figure 1:
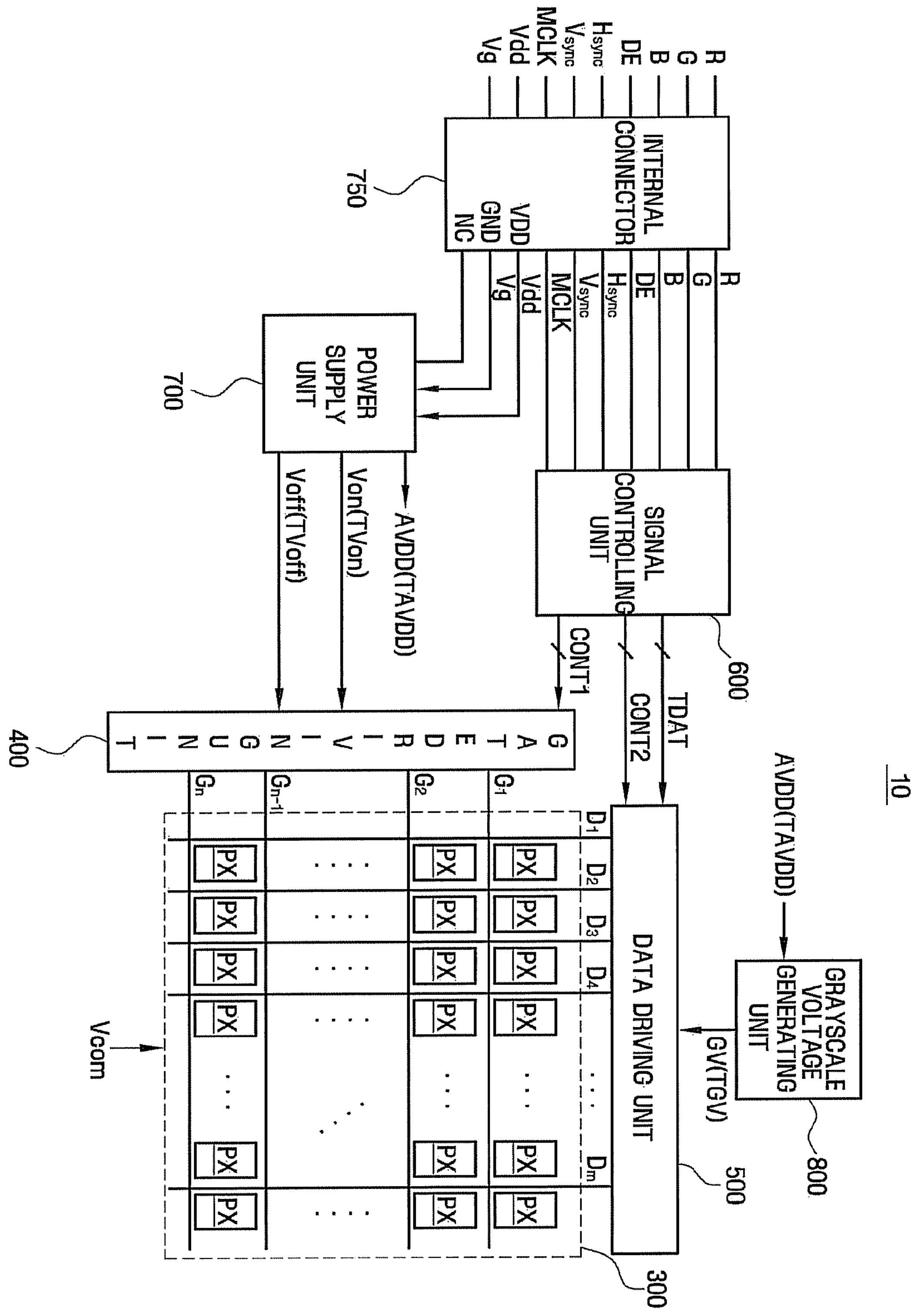
FIG. 1 is a block diagram of a liquid crystal display ("LCD") according to an exemplary embodiment of the present invention.

The invention will now be described more fully hereinafter with reference to the accompanying drawings, in which exemplary embodiments of the invention are shown. The present invention may, however, be embodied in many different forms and should not be construed as limited to the embodiments set forth herein. Rather, these embodiments are provided so that this disclosure will be thorough and complete, and will fully convey the scope of the invention to those skilled in the art. Like reference numerals refer to like elements throughout.

It will be understood that when an element is referred to as being "on" another element, it can be directly on the other element or intervening elements may be present therebetween. In contrast, when an element is referred to as being "directly on" another element, there are no intervening elements present. As used herein, the term "and/or" includes any and all combinations of one or more of the associated listed items.

It will be understood that although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of the present invention.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," or "includes" and/or "including," when used in this specification, specify the presence of stated features, regions, integers, steps, operations, elements and/or components, but do not preclude the presence or addition of one or more other features, regions, integers, steps, operations, elements, components and/or groups thereof.

Furthermore, relative terms, such as "lower" or "bottom" and "upper" or "top" may be used herein to describe one element's relationship to other elements as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on the "upper" side of the other elements. The exemplary term "lower" can, therefore, encompass both an orientation of "lower" and "upper," depending upon the particular orientation of the figure. Similarly, if the device in one of the figures were turned over, elements described as "below" or "beneath" other elements would then be oriented "above" the other elements. The exemplary terms "below" or "beneath" can, therefore, encompass both an orientation of above and below.

Unless otherwise defined, all terms (including technical and scientific terms) used herein have the same meaning as commonly understood by one of ordinary skill in the art to which the present invention belongs. It will be further understood that terms, such as those defined in commonly used dictionaries, should be interpreted as having a meaning which is consistent with their meaning in the context of the relevant art and the present disclosure, and will not be interpreted in an idealized or overly formal sense unless expressly so defined herein.

Exemplary embodiments of the present invention are described herein with reference to cross section illustrations which are schematic illustrations of idealized embodiments of the present invention. As such, variations from the shapes of the illustrations as a result, for example, of manufacturing techniques and/or tolerances, are to be expected. Thus, embodiments of the present invention should not be construed as limited to the particular shapes of regions illustrated herein but are to include deviations in shapes which result, for example, from manufacturing. For example, a region illustrated or described as flat may, typically, have rough and/or nonlinear features. Moreover, sharp angles which are illustrated may be rounded. Thus, the regions illustrated in the figures are schematic in nature and their shapes are not intended to illustrate the precise shape of a region and are not intended to limit the scope of the present invention.

Figure 2:
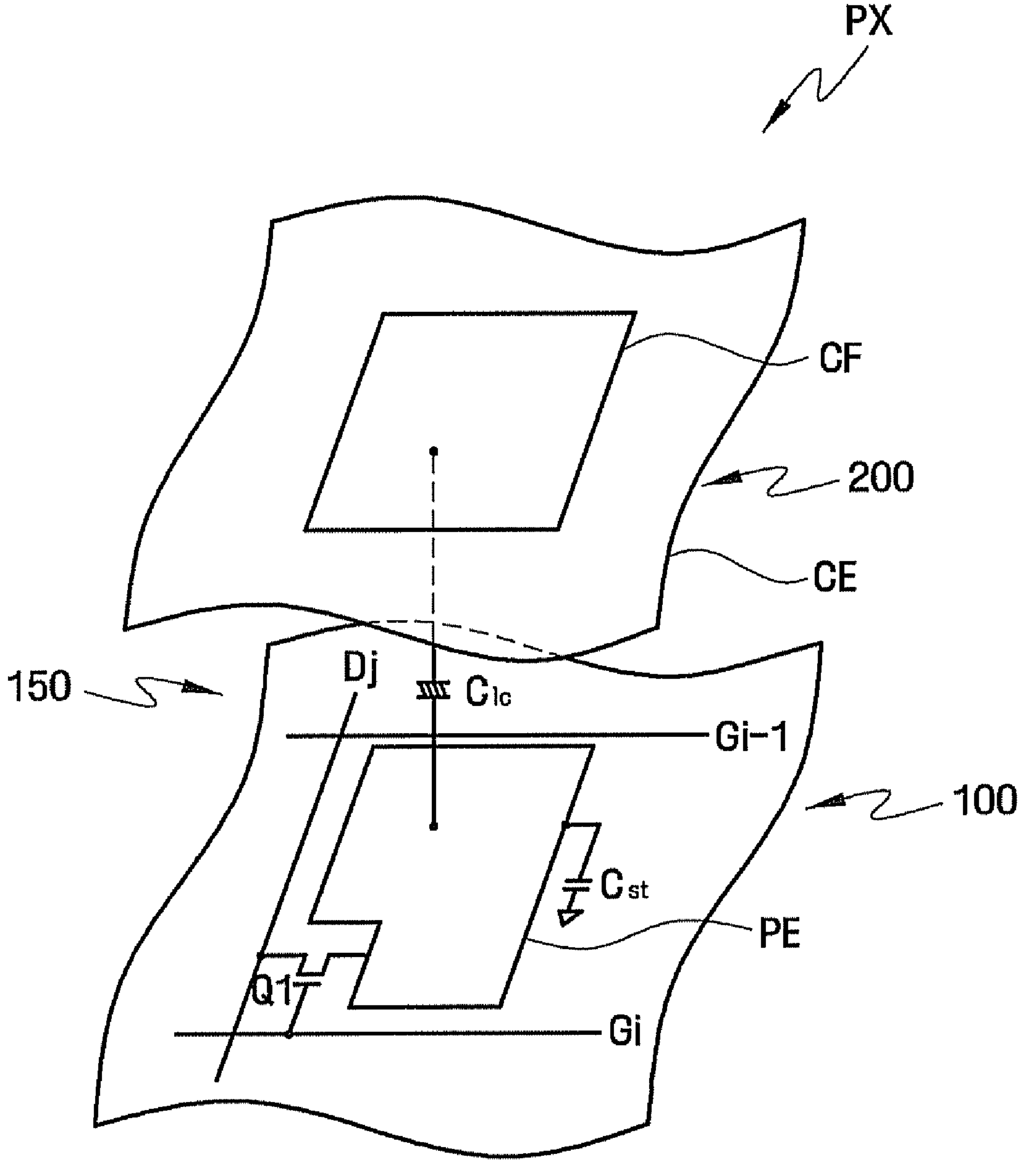
FIG. 2 is an equivalent circuit diagram of one pixel of the LCD of FIG. 1 according to an exemplary embodiment of the present invention.
Figure 3:
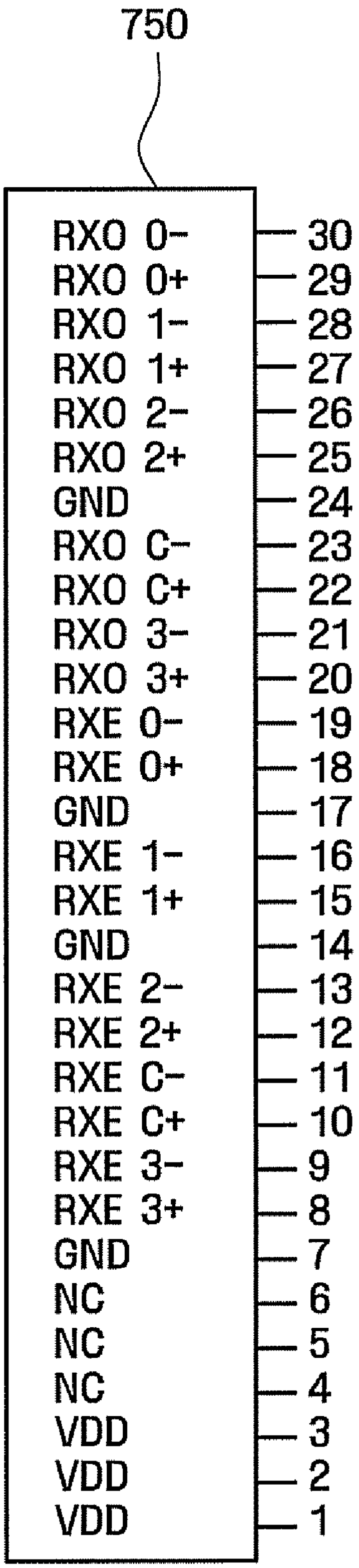
FIG. 3 is a plan view of a connector of the LCD of FIG. 1 according to an exemplary embodiment of the present invention.
Figure 4:
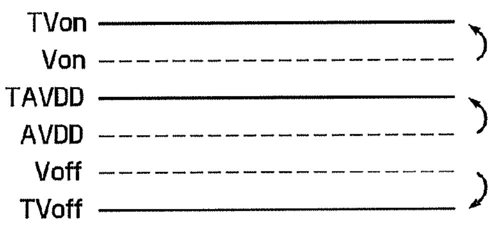
FIG. 4 is a graph which illustrates levels of voltages supplied from a power supply unit of the LCD of FIG. 1 according to an exemplary embodiment of the present invention.

A liquid crystal display ("LCD") according to an exemplary embodiment of the present invention and a method of testing the same will now be described more fully with reference to the accompanying drawings. FIG. 1 is a block diagram of an LCD according to an exemplary embodiment of the present invention, FIG. 2 is an equivalent circuit diagram of one pixel of the LCD of FIG. 1 according to an exemplary embodiment of the present invention, FIG. 3 is a plan view of a connector of the LCD of FIG. 1 according to an exemplary embodiment of the present invention, and FIG. 4 is a graph which illustrates levels of voltages supplied from a power supply unit of the LCD of FIG. 1 according to an exemplary embodiment of the present invention.

For purposes of clarification herein, voltages supplied during a normal operation of the power supply unit of the LCD from voltages supplied during a test operation of the power supply unit of the LCD, the voltages supplied during the test operation are denoted in parentheses. For example, a normally-applied gate-off voltage designated Voff and a testing gate-off voltage TVoff will be denoted as Voff and Tvoff, respectively, herein.

Referring to FIG. 1, an LCD 10 according to an exemplary embodiment of the present invention includes a liquid crystal panel assembly 300, a gate driving unit 400, a data driving unit 500, a signal controlling unit 600, a power supply unit 700, a grayscale voltage generating unit 800 and an internal connector 750.

The liquid crystal panel assembly 300 includes a plurality of display signal lines $G_1$-$G_n$ and $D_1$-$D_m$, and a plurality of pixels PX which are connected to the display signal lines $G_1$-$G_n$ and $D_1$-$D_m$ and arranged in a matrix form, as shown in FIG. 1.

The display signal lines include a plurality of gate lines $G_1$-$G_n$ which transmit a gate signal, and a plurality of data signals $D_1$-$D_m$ which transmit a data signal. The gate lines $G_1$-$G_n$ substantially extend in a transverse direction and are parallel to one another, while the data lines $D_1$-$D_m$ substantially extend in a longitudinal direction and are parallel to one another.

Referring to FIG. 2, each pixel PX of an LCD according to an exemplary embodiment of the present invention includes a first display panel 100, a second display panel 200 and a liquid crystal layer 150 which is interposed between the first display panel 100 and the second display panel 200. A color filter CF may be provided on an area of a common electrode CE of the second display panel 200 to face a pixel electrode PE of the first display panel 100. The pixel PX, which is connected to a corresponding gate line and a corresponding data line, e.g., ith gate line Gi (i=1−n) and jth data line Dj (j=1−m), includes a first switching device Q1, and a liquid crystal capacitor $C_{lc}$ and a storage capacitor $C_{st}$ connected thereto. In alternative exemplary embodiments, the storage capacitor $C_{st}$ may be eliminated.

Referring back to FIG. 1, the internal connector 750 is connected to an outside graphic controller (not shown) from which it receives a plurality of signals, and transmits the plurality of received signals to the LCD 10. For example, the internal connector 750 receives red, green and blue image signals R, G and B, respectively, and input control signals which control display of the image signals R, G and B, and transmits the received image signals R, G and B to the signal controlling unit 600. Examples of the input control signals include a vertical synchronizing signal Vsync, a horizontal synchronizing signal Hsync, a main clock signal MCLK and a data enable signal DE, but are not limited thereto. Moreover, the internal connector 750 receives a power supply voltage Vdd from an outside source (not shown) and supplies the power supply voltage Vdd to the power supply unit 700. The internal connector 750 includes input pins which receive and transmit the image signals R, G and B as described above, power supply voltage pin VDD which receives and transmits the power supply voltage Vdd and ground pin GND which receives a ground voltage Vg, and no-connect pin NC.

Referring to FIG. 3, the internal connector 750 may be a 30-pin connector standardized by, e.g., but is not limited thereto, the Panel Standardization Working Group ("PSWG"). In one exemplary embodiment of the present invention, a connector standardized by the PSWG includes first through third pins which receive the power supply voltages Vdd, fourth through sixth pins which are no-connect pins NC, seventh, fourteenth, seventeenth, and twenty-fourth pins which are ground pins GND which receive the ground voltage Vg and the remaining pins are pins which receive image signals and clock signals as indicated in FIG. 3. More specifically, with respect to "RXO" and "RXE" as shown in FIG. 3, "RX", "O" and "E" are abbreviations for Receiver, Odd, and Even, respectively and the internal connector 750 includes RXO pins and RXE pins to transmit data in a dual transmission method to increase a bandwidth of the image and clock signals. For example, the image signals are input to RXO 0−, RXO 0+, RXO 1−, RXO 1+, RXO 2−, RXO 2+, RXO 3−, RXO 3+, RXE 0−, RXE 0+, RXE 1−, RXE 1+, RXE 2−, RXE 2+, RXE 3− and RXE 3+, and the clock signals are input to RXO C−, RXO C+, RXE C− and RXE C+. In an exemplary embodiment of the present invention, the no-connect pins NC, the ground pins GND and the power supply voltage pins VDD of the internal connector 750 are connected to the power supply unit 700 (FIG. 1).

Referring again to FIG. 1, the gate driving unit 400 receives a gate control signal CONT1 from the signal controlling unit 600 and applies gate signals to gate lines $G_1$-$G_n$. The gate signals include a gate-on voltage Von and a gate-off voltage Voff supplied from the power supply unit 700 during normal operation. During testing, the gate signals include a testing gate-on voltage TVon and a testing gate-off voltage TVoff. In an exemplary embodiment, the testing gate-on voltage TVon is higher than the gate-on voltage Von for normal operation, and the testing gate-off voltage TVoff is lower than the gate-off voltage Voff for normal operation.

The gate control signal CONT1 is a signal for controlling the operation of the gate driving unit 400, and may include a vertical starting signal (not shown) for initiating operation of the gate driving unit 400, a gate clock signal for controlling the output time of the gate-on voltage Von and an output enable signal (not shown) for determining the pulse width of the gate-on voltage Von, for example, but is not limited thereto.

The grayscale voltage generating unit 800 divides a driving voltage AVDD supplied from the power supply unit 700 and supplies a plurality of grayscale voltages GV to the data driving unit 500 during normal operation, and divides a testing driving voltage TAVDD and supplies a plurality of testing grayscale voltages TGV to the data driving unit 500 during testing.

The data driving unit 500 receives a data control signal CONT2 and a testing image signal TDAT, described in further detail later, from the signal controlling unit 600. The data driving unit 500 operates in response to the data control signal CONT2 to select image data voltages (not shown) corresponding to image signals (not shown) among the grayscale voltages GV or the testing grayscale voltages TGV received from the grayscale voltage generating unit 800, and apply the selected image data voltages to the data lines $D_1$-$D_m$. Further, the data control signal CONT2 is a signal for controlling the operation of the data driving unit 500 and may include a horizontal starting signal (not shown) for initiating the operation of the data driving unit 500 or an output control signal (not shown) for controlling the output of the data voltages, for example, but is not limited thereto.

In an exemplary embodiment of the present invention, the gate driving unit 400 and/or the data driving unit 500 may be directly mounted on the liquid crystal panel assembly 300 in the form of a plurality of driving integrated circuit ("IC") chips. In alternative exemplary embodiments, the gate driving unit 400 or the data driving unit 500 may be mounted on a flexible printed circuit film (not shown) and made into a tape carrier package, and the tape carrier package may be attached to the liquid crystal panel assembly 300, or the gate driving unit 400 or the data driving unit 500 may be integrated on the liquid crystal panel assembly 300, together with the display signal lines $G_1$-$G_n$ and $D_1$-$D_m$ and switching devices Q1 (FIG. 2), for example, but are not limited thereto.

The signal controlling unit 600 receives the image signals R, G and B and the input control signals for controlling the display of the image signals R, G and B from the internal connector 750, and generates and supplies the gate control signal CONT1 and the data control signal CONT2 to the gate driving unit 400 and the data driving unit 500, respectively.

The power supply unit 700 receives the power supply voltage Vdd from the internal connector 750 and supplies voltages required to operate the LCD 10 such as the gate-on voltage Von, a gate-off voltage Voff and a common voltage Vcom, for example, but is not limited thereto. More specifically, referring to FIGS. 3 and 4 together with FIG. 1, the power supply unit 700 supplies the driving voltage AVDD, the gate-on voltage Von, and the gate-off voltage Voff during normal operation. During testing, the power supply unit 700 supplies the testing driving voltage TAVDD and the testing gate-on voltage TVon, which are higher than the driving voltage AVDD and the gate-on voltage Von during normal operation, respectively, and the testing gate-off voltage TVoff which is lower than the gate-off voltage Voff for normal operation. During testing, the no-connect pin NC is electrically connected to the ground pin GND in the internal connector 750. During normal operation, the no-connect pin NC is electrically disconnected from the ground pin GND in the internal connector 750. For example, depending on whether there is an electrical connection or disconnection between the no-connect pin NC and the ground pin GND in the internal connector 750, the power supply unit 700 supplies either the driving voltage AVDD, the gate-on voltage Von, and the gate-off voltage Voff, or the testing driving voltage TAVDD and the testing gate-on voltage TVon, which are higher than the driving voltage AVDD and the gate-on voltage Von, respectively, and the testing gate-off voltage TVoff, which is lower than the gate-off voltage Voff for normal operation. A more detailed description thereof will be described below.

Figure 5:
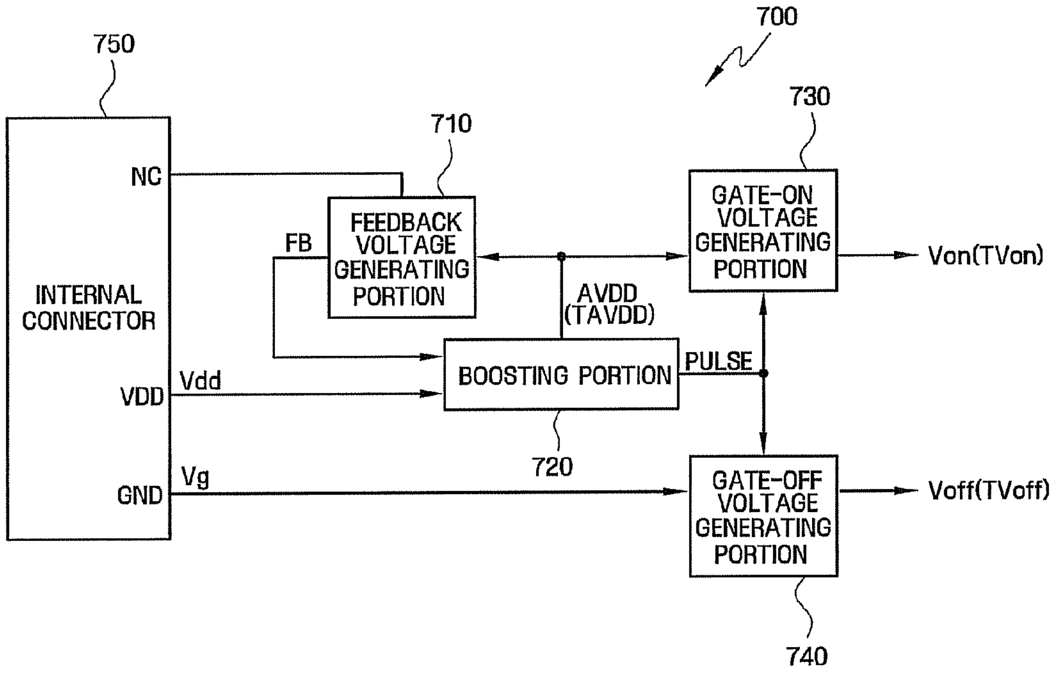
FIG. 5 is a block diagram of a power supply unit of the LCD of FIG. 1 according to an exemplary embodiment of the present invention.
Figure 6:
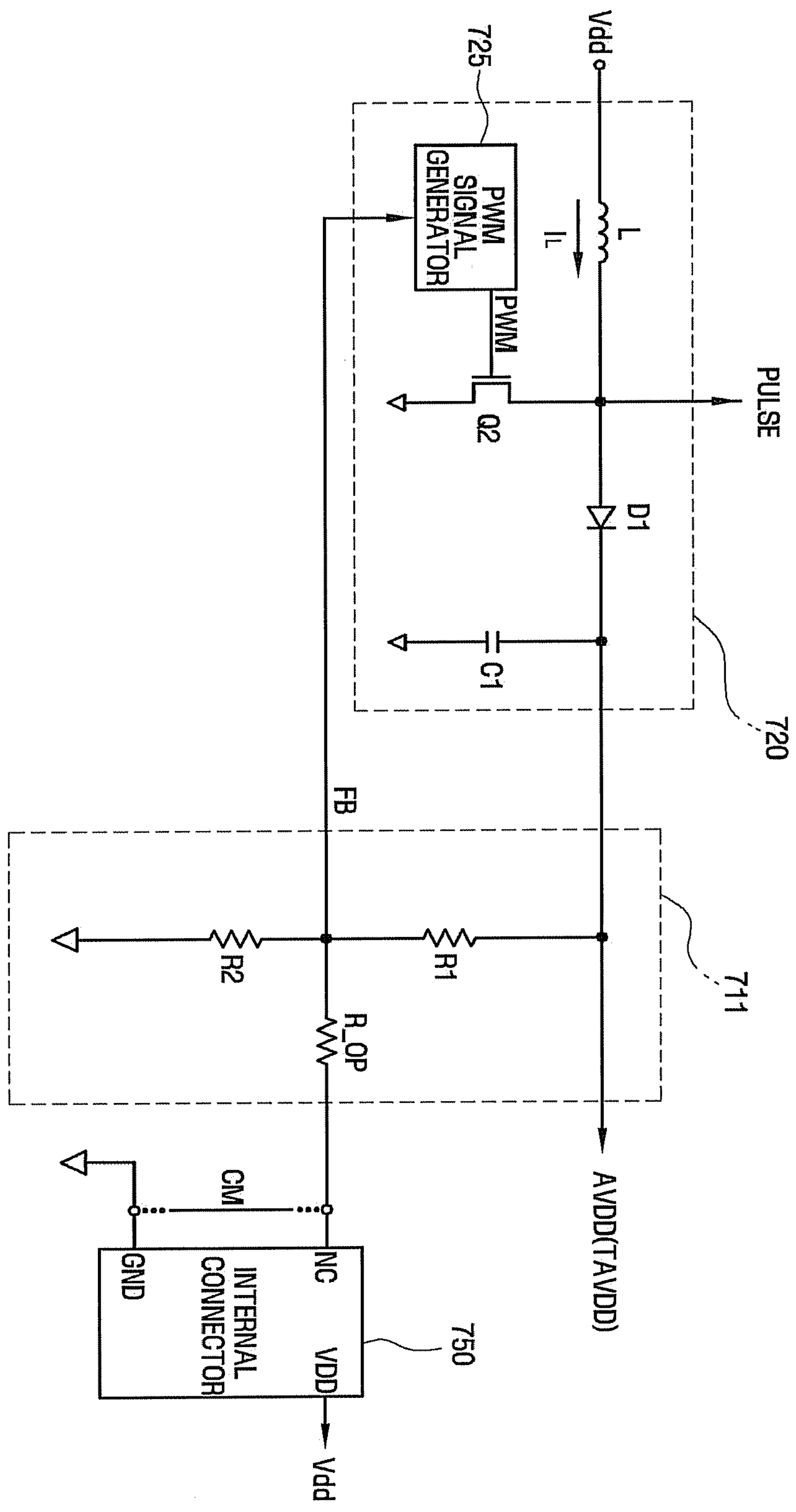
FIG. 6 is a schematic circuit view of a boosting portion and a feedback voltage generating portion of the power supply unit of FIG. 5 according to an exemplary embodiment of the present invention.
Figure 7:
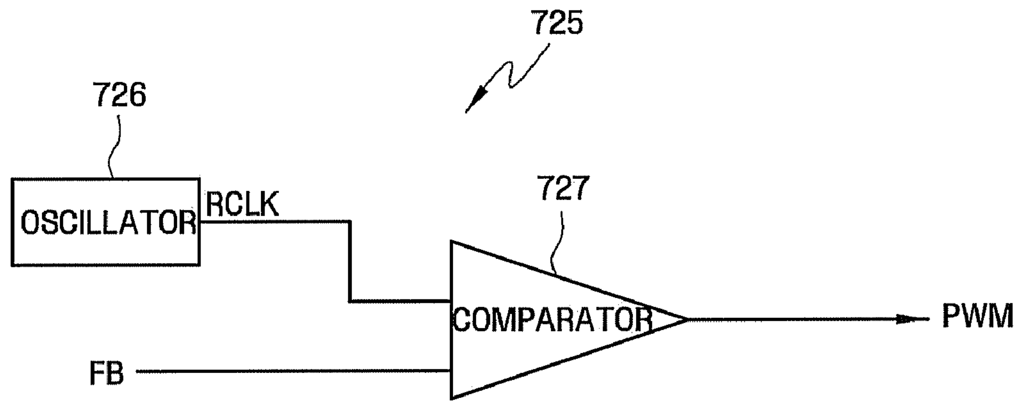
FIG. 7 is a block diagram of a pulse width modulation signal generator of the boosting portion of the power supply unit of FIG. 6 according to an exemplary embodiment of the present invention.
Figure 8:
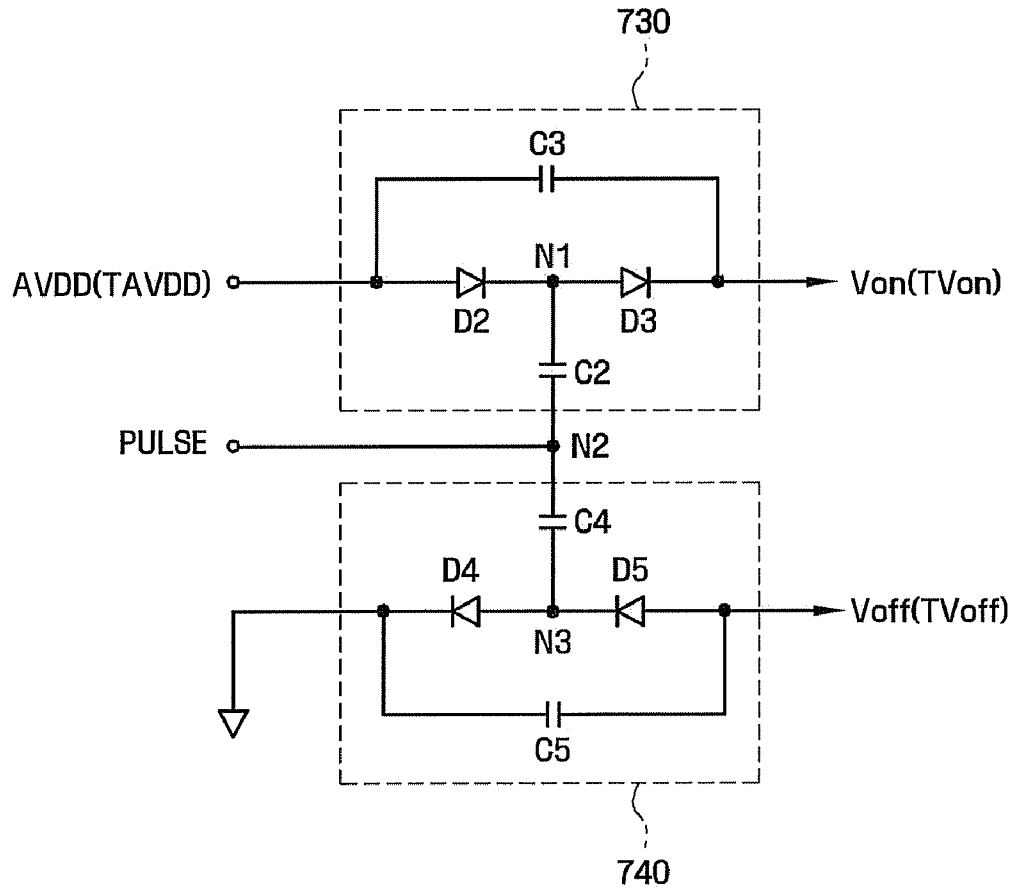
FIG. 8 is a schematic circuit view of a gate-on voltage generating portion and a gate-off voltage generating portion of the power supply unit of FIG. 5 according to an exemplary embodiment of the present invention.

FIG. 5 is a block diagram of the power supply unit 700 of FIG. 1, FIG. 6 is a schematic circuit view of a boosting portion and a feedback voltage generating portion of the power supply unit 700 of FIG. 5 according to an exemplary embodiment of the present invention, FIG. 7 is a block diagram of a pulse width modulation signal generator of FIG. 6 according to an exemplary embodiment of the present invention, and FIG. 8 is a schematic circuit view of a gate-on voltage generating portion and a gate-off voltage generating portion of the power supply unit of FIG. 5 according to an exemplary embodiment of the present invention.

Referring to FIG. 5, the power supply unit 700 includes a boosting portion 720, a gate-on voltage generating portion 730, a gate-off voltage generating portion 740, and a feedback voltage generating portion 710.

The power supply voltage pin VDD of the internal connector 750 is connected to the boosting portion 720, the no-connect pin NC is connected to the feedback voltage generating portion 710, and the ground pin GND is connected to the gate-off voltage generating portion 740.

The boosting portion 720 boosts the power supply voltage Vdd and outputs a driving voltage AVDD and a pulse signal PULSE whose voltage levels vary according to a feedback voltage FB. In an exemplary embodiment, when the feedback voltage FB falls, the driving voltage AVDD and the voltage of the pulse signal PULSE rise; conversely, when the feedback voltage FB rises, the driving voltage AVDD and the voltage of the pulse signal PULSE fall. Further, when the no-connect pin NC and the ground pin GND are electrically connected to each other in the internal connector 750, the feedback voltage generating portion 710 reduces the feedback voltage FB. Put another way, when the no-connect pin NC is electrically connected to the ground pin GND, the feedback voltage generating portion 710 supplies a lower feedback voltage FB to the boosting portion 720, compared with when the no-connect pin NC is electrically disconnected from the ground pin GND. In addition, the boosting portion 720 outputs a testing driving voltage TAVDD which is higher than the driving voltage AVDD for normal operation, and a pulse signal PULSE which is a higher voltage than the pulse signal PULSE for normal operation. The boosting portion 720 and the feedback voltage generating portion 710 will be described in further detail later with reference to FIGS. 6 and 7.

During normal operation, the gate-on voltage generating portion 730 outputs a gate-on voltage Von obtained by shifting the driving voltage AVDD (FIG. 4) by a value approximately equal to the voltage of the pulse signal PULSE. During testing, e.g., when the no-connect pin NC is electrically connected to the ground pin GND, the gate-on voltage generating portion 730 outputs a testing gate-on voltage TVon. The gate-on voltage generating portion 730 will be described in further detail later with reference to FIG. 8.

During normal operation, the gate-off voltage generating portion 740 outputs a gate-off voltage Voff obtained by shifting a ground voltage by a value approximately equal to the voltage of the pulse signal PULSE (FIG. 4). During testing, e.g., when the no-connect pin NC is electrically connected to the ground pin GND, the gate-off voltage generating portion 740 outputs a testing gate-off voltage TVoff. The gate-off voltage generating portion 740 will be described in further detail later with reference to FIG. 8.

The boosting portion 720 and the feedback voltage generating portion 710 will now be described in further detail with reference to FIG. 6.

Referring to FIGS. 5 and 6, with respect to the feedback voltage generating portion 710, the feedback voltage generating portion 710 includes a first resistor R1 and a second resistor R2, which are used for dividing the driving voltage AVDD, and an optional resistor R_OP. The first resistor R1 is connected between the driving voltage AVDD and the feedback voltage FB, and the second resistor R2 is connected between the feedback voltage FB and the ground voltage Vg. A terminal of the optional resistor R_OP is connected to the feedback voltage FB, and the other terminal is connected to the no-connect pin NC of the internal connector 750.

When the no-connect pin NC is electrically disconnected from the ground pin GND, the optional resistor R_OP is floating, and the feedback voltage FB is set to a voltage level obtained by dividing the driving voltage AVDD by the first resistor R1 and the second resistor R2. For example, when the no-connect pin NC are electrically disconnected from the ground pin GND, the boosting portion 720 outputs the driving voltage AVDD for normal operation.

During testing, the no-connect pin NC of the internal connector 750 is electrically connected to the ground pin GND of the internal connector 750 by a conductive connecting member CM. Therefore, the optional resistor R_OP is connected to the ground voltage. Since the optional resistor R_OP is connected in electrical parallel to the second resistor R2, the equivalent resistance between the feedback voltage FB and the ground voltage decreases, causing the feedback voltage FB to fall. When the feedback voltage FB falls, the boosting portion 720 outputs the testing driving voltage TAVDD, which is higher than the driving voltage AVDD for normal operation, and a pulse signal PULSE of a higher voltage than the pulse signal PULSE for normal operation. Therefore, the power supply unit 700 supplies the testing driving voltage TAVDD and the testing gate-on voltage TVon which are higher than the driving voltage AVDD and the gate-on voltage Von for normal operation, and the testing gate-off voltage TVoff which is lower than the gate-off voltage Voff for normal operation. In an exemplary embodiment, the no-connect pin NC and the ground pin GND are electrically connected through the conductive connecting member CM, which is a cable, for example, but is not limited thereto.

The boosting portion 720 may be a boost converter as illustrated in FIG. 6 and include an inductor L which receives the power supply voltage Vdd from the internal connector 750, a first diode D1 including an anode connected to the inductor L and a cathode connected to the first resistor R1, a first capacitor C1 connected between the first diode D1 and the ground voltage, and a pulse width modulation ("PWM") signal generator 725 connected to a gate terminal of a switching device Q2. In an exemplary embodiment, the boost converter shown in FIG. 6 is an example of the boosting portion 720, but alternative exemplary embodiments are not limited thereto. For example, the boosting portion 720 may be selected from other kinds of converters. Furthermore, in alternative exemplary embodiments, a lower voltage than the power supply voltage Vdd shown in FIG. 6 may be applied to the boosting portion 720 through a voltage divider (not shown).

With respect to the operation of the boosting portion 720, when a PWM signal PWM output from the PWM signal generator 725 is at a high level state, the switching device Q2 is turned on, and thus, a current $I_L$ flowing in the inductor L increases in proportion to the power supply voltage Vdd according to current/voltage characteristics of the inductor L.

When the PWM signal PWM is in a low level state, the switching device Q2 is turned off. Thus, the current $I_L$ flowing in the inductor L passes through the first diode D1, and a voltage is charged in the first capacitor C1 according to the current/voltage characteristics of the first capacitor C1. As a result, the power supply voltage Vdd is boosted to a predetermined voltage, and the boosted voltage is output through the power supply unit 700. Here, the duty ratio of the PWM signal PWM varies according to the feedback voltage FB, and the amount of the current $I_L$ flowing in the inductor L varies according to the duty ratio of the PWM signal PWM. Accordingly, the driving voltage AVDD and the voltage of the pulse signal PULSE rise or fall.

When the no-connect pin NC is electrically connected to the ground pin GND, the boosting portion 720 outputs a pulse signal PULSE of a higher voltage than the pulse signal PULSE for normal operation, and the testing driving voltage TAVDD which is higher than the driving voltage AVDD for normal operation.

The operation of the PWM signal generator 725 outputting the PWM signal PWM having a different duty ratio according to the feedback voltage FB will now be described with reference to FIGS. 6 and 7. An oscillator 726 generates a reference clock signal RCLK which has a constant frequency. A comparator 727 compares the reference clock signal RCLK generated from the oscillator 726 and the feedback voltage FB. When the feedback voltage FB is higher than the voltage of the reference clock signal RCLK, the PMW signal generator 725 generates the PWM signal PWM of a high voltage. When the feedback voltage FB is lower than the voltage of the reference clock signal RCLK, the PMW signal generator 725 generates the PWM signal PWM of a low voltage. Since the frequency of the reference clock signal RCLK is constant, the duty ratio of the PWM signal PWM varies only according to the feedback voltage FB. The PWM signal generator 725 is not limited to the above-illustrated example, and may be a different circuit generating a PWM signal PWM having a different duty ratio according to the feedback voltage FB in an alternative exemplary embodiment.

The gate-on voltage generating portion 730 and the gate-off voltage generating portion 740 used as charge-pumping circuits will now be described with reference to FIG. 8.

Referring to FIGS. 5 and 8, the gate-on voltage generating portion 730 includes second and third diodes D2 and D3 and second and third capacitors C2 and C3. The driving voltage AVDD for normal operation or the testing driving voltage TAVDD for testing is applied to an anode of the second diode D2, and a cathode of the second diode D2 is connected to a first node N1. The second capacitor C2 is connected between the first node N1 and a second node N2 which receives the pulse signal PULSE. An anode of the third diode D3 is connected to the first node N1, and a cathode of the third diode D3 outputs the gate-on voltage Von for normal operation or the testing gate-on voltage TVon for testing. The third capacitor C3 is connected between the anode of the second diode D2 and the cathode of the third diode D3. However, the gate-on voltage generating portion 730 is not limited to the exemplary embodiment described herein, and may include different combinations and/or numbers of diodes and/or capacitors.

With respect to the operation of the gate-on voltage generating portion 730, when the pulse signal PULSE is applied to the second capacitor C2, the first node N1 outputs a voltage which is higher than the driving voltage AVDD by an approximate value of the voltage of the pulse signal PULSE during normal operation, and a pulse of a voltage which is higher than the testing driving voltage TAVDD by an approximate value of the pulse signal PULSE during testing. The third diode D3 and the third capacitor C3 clamp the voltage at the first node N1 to output the gate-on voltage Von or the testing gate-on voltage TVon. For example, the gate-on voltage Von for normal operation is a DC voltage shifted from the driving voltage AVDD by approximately the voltage of the pulse signal PULSE, and the testing gate-on voltage TVon is a DC voltage shifted from the testing driving voltage TAVDD by approximately the voltage of the pulse signal PULSE.

The gate-off voltage generating portion 740 includes fourth and fifth diodes D4 and D5 and fourth and fifth capacitors C4 and C5. A cathode of the fourth diode D4 is connected to the ground voltage, and an anode of the fourth diode D4 is connected to a third node N3. The fourth capacitor C4 is connected between the third node N3 and the second node N2 which receives the pulse signal PULSE. A cathode of the fifth diode D5 is connected to the third node N3, and the fifth capacitor C5 is connected between the cathode of the fourth diode D4 and the anode of the fifth diode D5. The anode of the fifth diode D5 outputs the gate-off voltage Voff or the testing gate-off voltage TVoff. The gate-off voltage generating portion 740 is not limited to the exemplary embodiment described herein, and may include different combinations and/or numbers of diodes and/or capacitors.

With respect to the operation of the gate-off voltage generating portion 740, when the pulse signal PULSE is applied to the fourth capacitor C4, the third node N3 outputs a voltage which is lower than the ground voltage and is obtained using the voltage of the pulse signal PULSE. Here, with respect to the voltage of the pulse signal PULSE, the voltage of the pulse signal PULSE when the no-connect pin NC is electrically connected to the ground pin GND is higher than that when the no-connect pin NC is electrically disconnected from the ground pin GND, as described above. The fifth diode D5 and the fifth capacitor C5 clamp the voltage at the third node N3 to output the gate-off voltage Voff or the testing gate-off voltage TVoff. For example, the gate-off voltage Voff or the testing gate-off voltage TVoff is a DC voltage shifted from the ground voltage by approximately the voltage of the pulse signal PULSE.

In summary, when no-connect pin NC is electrically connected to the ground pin GND, the power supply unit 700 (FIG. 1) supplies a testing driving voltage TAVdd, a testing gate-on voltage TVon, and a testing gate-off voltage TVoff. Therefore, since the power supply unit 700 itself generates the testing voltages described above, there is no need for a separate external HVS testing apparatus to test the LCD 10 according to exemplary embodiments of the present invention.

Figure 9:
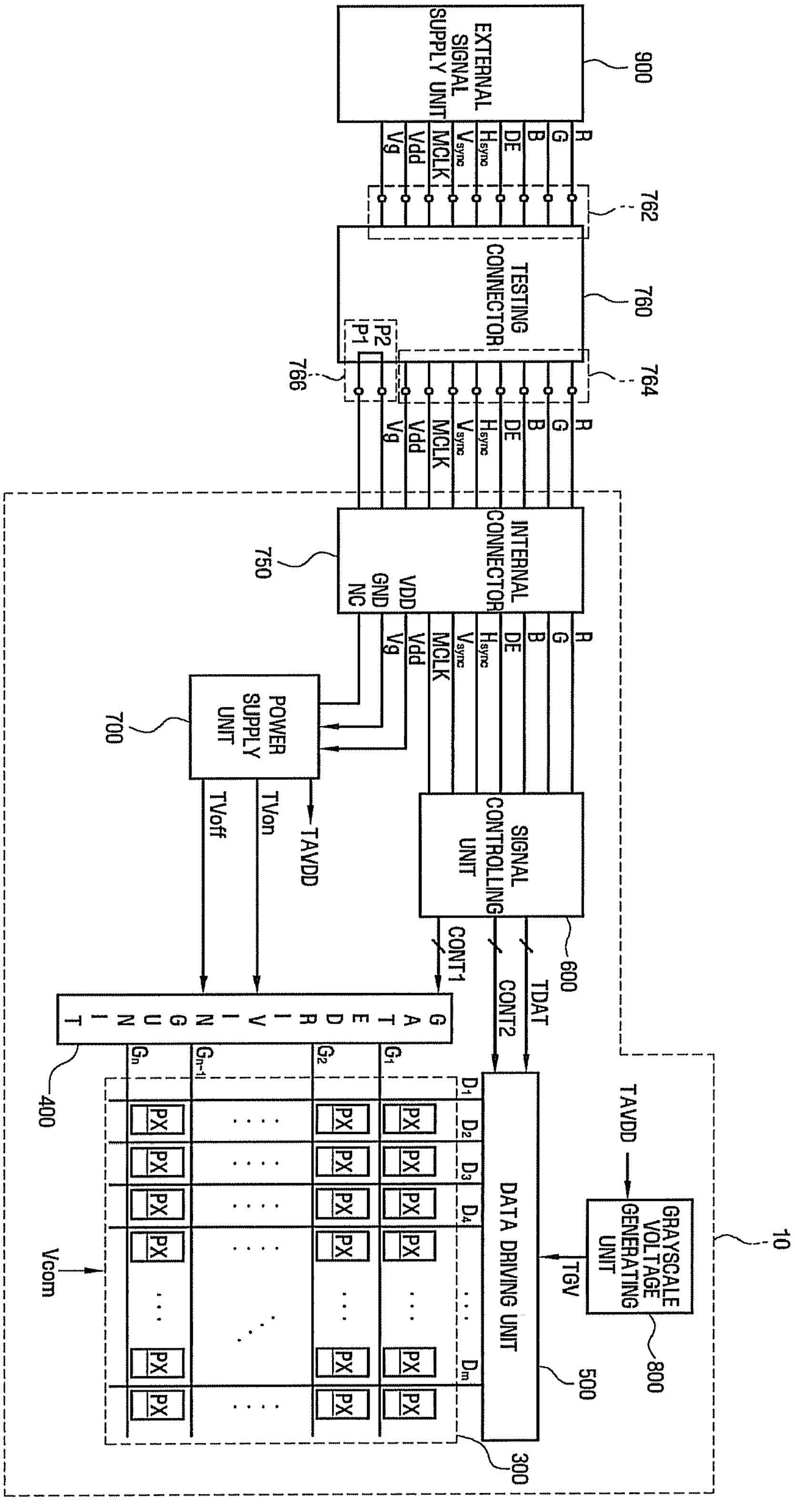
FIG. 9 is a block diagram of a connector for testing an LCD according to an exemplary embodiment of the present invention.

A connector for testing an LCD according to an exemplary embodiment of the present invention will be described in further detail hereinafter with reference to FIG. 9. FIG. 9 is a block diagram of a connector for testing an LCD according to an exemplary embodiment of the present invention. For convenience of explanation, common components an LCD having the same functions as described above in reference to previous exemplary embodiments of the present invention are identified by the same reference numerals as in FIG. 1, and descriptions of these components will not be repeated.

Referring to FIG. 9, a connector includes an external signal supply unit 900 which supplies testing signals R, G, B, DE, Hsync, Vsync and MCLK; an LCD 10 to be tested; and a testing connector 760 transmitting the testing signals R, G, B, DE, Hsync, Vsync and MCLK received from the external signal supply unit 900 to an LCD 10.

In order to test the LCD 10, the testing connector 760 is connected to an internal connector 750 of the LCD 10 and to the external signal supply unit 900.

The external signal supply unit 900 supplies testing image signals R, G, and B, control signals DE, Hsync, Vsync and MCLK., and a power supply voltage Vdd (not shown). In an exemplary embodiment, the testing image signals R, G and B may be patterned signals for testing a display quality of the LCD 10.

The testing connector 760 includes input terminals 762, output terminals 764 and a connecting portion 766. The input terminals 762 receive the testing signals R, G, B, DE, Hsync, Vsync and MCLK from the external signal supply unit 900, and output terminals 764 transmit the received signals to the LCD 10. The connecting portion 766 includes a first connecting terminal P1 connected to a no-connect pin NC of the internal connector 750 of the LCD 10 and a second connecting terminal P2 connected to a ground pin GND. In FIG. 9, the first connecting terminal P1 is shown as being electrically connected to the second connecting terminal P2. The testing connector 760 supplies the testing signals R, G, B, DE, Hsync, Vsync and MCLK to the internal connector 750 of the LCD 10. In an exemplary embodiment, the testing connector 760 may receive the power supply voltage Vdd (not shown) and the ground voltage (not shown) from the external signal supply unit 900, but is not limited thereto, and supply the received voltages to the internal connector 750.

When the internal connector 750 is connected to the testing connector 760, the no-connect pin NC is electrically connected to the ground pin GND. Thus, a power supply unit 700 generates a testing driving voltage TAVDD, a testing gate-on voltage TVon, and a testing gate-off voltage TVoff, as described in greater above.

A signal controlling unit 600 supplies a testing image signal TDAT to a data driving unit 500, and the data driving unit 500 supplies an image data voltage corresponding to the testing image signal TDAT among the testing grayscale voltages TGV to a liquid crystal panel 300.

In summary, in response to the operation of the testing connector 760, the power supply unit 700 of the LCD 10 itself generates high voltages for testing, e.g., the testing driving voltage TAVDD, the testing gate-on voltage TVon, and the testing gate-off voltage TVoff. The LCD 10 is tested using the testing voltages TAVDD, TVon, and TVoff, and the testing image signals R, G and B supplied from the external signal supply unit 900 via the testing connector 760.

Another exemplary embodiment of the present invention provides a method for HVS testing an LCD device. To perform the HVS test, an LCD includes an internal connector having an input pin receiving a power supply voltage from an outside source, a no-connect pin, and a ground pin, and a power supply unit connected to the NC pin and the ground pin. The power supply unit receives the power supply voltage and outputs a gate-on voltage and a gate-off voltage whose levels are adjusted according to whether there is an electrical connection or disconnection between the no-connect pin and the ground pin, e.g., to perform the HVS test, the no-connect pin is electrically connected to the ground pin. When the no-connect pin is electrically connected to the ground pin, the gate-on voltage rises to become a testing gate-on voltage and the gate-off voltage falls to become a testing gate-off voltage. The testing gate-on and the testing gate-off voltages are applied to the LCD to perform the HVS test.

As described above, an LCD, a connector for testing the LCD and a method of testing the LCD according to exemplary embodiments of the present invention provide several advantages. For example, the LCD can be self-tested for HVS without a separately-provided HVS test apparatus. Thus, an HVS testing procedure for LCDs is simplified.

While the present invention has been particularly shown and described with reference to exemplary embodiments thereof, it will be understood by those of ordinary skill in the art that various modifications and changes in form and details may be made therein without departing from the spirit and scope of the present invention. It is therefore understood that the above exemplary embodiments are considered in all respects as illustrative and not restrictive and are intended to cover various modifications and equivalent arrangements of the present invention as described in the following claims.

What is claimed is:

1. A liquid crystal display comprising:

an internal connector comprising an input pin which receives a power supply voltage from an outside source, a no-connect pin and a ground pin;

a power supply unit connected to the no-connect pin and the ground pin, the power supply unit receives the power supply voltage and outputs a gate-on voltage and a gate-off voltage, a level of the gate-on voltage and the gate-off voltage is adjusted according to whether there is an electrical connection or disconnection between the no-connect pin and the ground pin;

a gate driving unit which receives the gate-on voltage and the gate-off voltage and outputs a gate signal; and a liquid crystal panel comprising a plurality of pixels and which receives the gate signal and displays an image according to the gate signal.

2. The liquid crystal display of claim 1, wherein the gate-on voltage rises and the gate-off voltage falls when the no-connect pin is electrically connected to the ground pin.

3. The liquid crystal display of claim 1, wherein the liquid crystal display is tested when the no-connect pin is electrically connected to the ground pin.

4. The liquid crystal display of claim 1, wherein the liquid crystal display operates normally when the no-connect pin is electrically disconnected from the ground pin, and the gate-on voltage is lower and the gate-off voltage is higher compared to when the no-connect pin is electrically connected to the ground pin.

5. The liquid crystal display of claim 1, wherein the power supply unit comprises:

a boosting portion which boosts a first input voltage and outputs a driving voltage and a pulse signal whose voltage levels vary according to a feedback voltage;

a feedback voltage generating portion which divides the driving voltage to generate the feedback voltage;

a gate-on voltage generating portion which outputs the gate-on voltage by shifting the driving voltage by the voltage level of the pulse signal; and a gate-off voltage generating portion which outputs the gate-off voltage by shifting a second input voltage by the voltage level of the pulse signal.

6. The liquid crystal display of claim 5, wherein when the no-connect pin is electrically connected to the ground pin, the feedback voltage falls, the gate-on voltage rises, and the gate-off voltage falls.

7. The liquid crystal display of claim 5, wherein the feedback voltage generating portion comprises:

a first resistor connected between a first terminal which supplies the driving voltage and a second terminal which supplies the feedback voltage;

a second resistor connected between the second terminal and a third terminal which is connected to a ground voltage and an optional resistor connected between the second terminal and the no-connect pin.

8. The liquid crystal display of claim 1, further comprising a connecting member which electrically connects the no-connect pin and the ground pin when the liquid crystal display is tested.

9. A method of testing a liquid crystal display, the method comprising:

providing a liquid crystal display to be tested, the liquid crystal display comprising:

an internal connector comprising an input pin receiving a power supply voltage from an outside source, a no-connect pin, and a ground pin; and a power supply unit connected to the no-connect pin and the ground pin, the power supply unit receiving the power supply voltage and outputting a gate-on voltage and a gate-off voltage whose levels are adjusted according to whether there is an electrical connection or disconnection between the no-connect pin and the ground pin; and electrically connecting the no-connect pin and the ground pin.

10. The method of claim 9, wherein the gate-on voltage rises and the gate-off voltage falls when the no-connect pin is electrically connected to the ground pin.

11. The method of claim 9, wherein the electrical connecting of the no-connect pin and the ground pin comprises connecting a connector to the internal connector, the connector comprising:

a transmitting unit which receives the power supply voltage, and the ground voltage and transmits the received power supply voltage, and the ground voltage to the liquid crystal display; and a connecting unit which electrically connects the no-connect pin and the ground pin in the internal connector.

12. The method of claim 9, wherein the power supply unit comprises:

a boosting portion boosting a first input voltage and outputting a driving voltage and a pulse signal whose voltage levels vary according to a feedback voltage;

a feedback voltage generating portion dividing the driving voltage and generating the feedback voltage;

a gate-on voltage generating portion outputting the gate-on voltage by shifting the driving voltage by the voltage level of the pulse signal; and a gate-off voltage generating portion outputting the gate-off voltage by shifting a second input voltage by the voltage level of the pulse signal, and wherein the electrical connecting of the NC pin and the ground pin comprises causing the feedback voltage to fall.

13. The method of claim 12, wherein the feedback voltage generating portion comprises:

a first resistor connected between a first terminal supplying the driving voltage and a second terminal supplying the feedback voltage; and a second resistor connected between the second terminal and a third terminal which is connected to a ground voltage, and an optional resistor connected between the second terminal and the no-connect pin, wherein the electrical connecting of the no-connect pin and the ground pin comprises causing an equivalent resistance between the feedback voltage and the ground voltage to fall.

* * * * *